United States Patent
Kang et al.

(10) Patent No.: US 7,999,367 B2
(45) Date of Patent: Aug. 16, 2011

(54) STACKED MEMORY DEVICE

(75) Inventors: Uk-song Kang, Yongin-si (KR); Jung-bae Lee, Yongin-si (KR); Hoe-ju Chung, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 566 days.

(21) Appl. No.: 12/123,583

(22) Filed: May 20, 2008

(65) Prior Publication Data
US 2009/0039492 A1 Feb. 12, 2009

(30) Foreign Application Priority Data

Aug. 6, 2007 (KR) .................... 10-2007-0078709

(51) Int. Cl.
*H01L 23/02* (2006.01)

(52) U.S. Cl. ............... 257/686; 257/E23.012; 257/678; 257/777; 257/723; 257/E23.013

(58) Field of Classification Search .............. 257/678, 257/777, 723, 784, 786, 225.013
See application file for complete search history.

(56) References Cited

U.S. PATENT DOCUMENTS

| 6,740,981 | B2 * | 5/2004 | Hosomi | 257/778 |
| 2006/0076676 | A1 * | 4/2006 | Fratti | 257/728 |
| 2007/0228546 | A1 * | 10/2007 | So et al. | 257/690 |

FOREIGN PATENT DOCUMENTS

| JP | 2003060153 A | 2/2003 |
| KR | 1020060074146 A | 7/2006 |

* cited by examiner

*Primary Examiner* — N Drew Richards
*Assistant Examiner* — Mamadou Diallo
(74) *Attorney, Agent, or Firm* — Volentine & Whitt, PLLC

(57) ABSTRACT

A semiconductor memory device includes a stacked plurality of interposer chips, each interposer chip seating a smaller corresponding memory chip, wherein a lowermost interposer chip in the stacked plurality of interposer chips is mounted on a buffer chip. Each one of the stacked plurality of interposer chips includes a central portion having bond pads seating the corresponding memory device and a peripheral portion having a plurality of through silicon vias (TSVs). The respective pluralities of TSVs for adjacent interposer chips in the stacked plurality of interposer chips are connected via vertical connection elements to form multiple internal signal paths communicating write data from and read data to the buffer chip from respective memory chips.

13 Claims, 6 Drawing Sheets

STACKED MEMORY DEVICE

CROSS-REFERENCE TO RELATED PATENT APPLICATION

This application claims the benefit of Korean Patent Application No. 10-2007-0078709 filed on Aug. 6, 2007, the subject matter of which is hereby incorporated by reference.

BACKGROUND OF THE INVENTION

1. Field of the Invention

The invention relates generally to semiconductor memory devices, and more particularly to high-speed stacked memory devices.

2. Description of the Related Art

The development of contemporary semiconductor devices, and semiconductor memory devices in particular, is characterized by efforts to cooperatively improve overall device performance while reducing production costs, downscaling components, and increasing the packaging density of the constituent integrated circuits (ICs). Indeed, as the demand for greater integration density persists, new IC products and packaging techniques have been introduced. These IC packaging techniques include surface mount techniques that reduce the overall number of components and increase the density of constituent semiconductor "chips". Further, the continued reduction of the surface area on printed circuit boards (PCB) and similar substrates available to ICs has motivated a trend towards the vertical (or stacked) integration of multiple chips. By stacking chips one on top of the other a very densely integrated IC may be provided.

SUMMARY OF THE INVENTION

Embodiments of the present invention provide a high-speed semiconductor memory device formed, at least in part, by a stacked combination of memory chips.

In one embodiment, the invention provides a semiconductor memory device comprising; a buffer chip comprising a plurality of base bond pads receiving externally provided write data and providing read data, a first memory chip comprising first bond pads and seated in a central portion of a first interposer chip, the first interposer chip being larger in area than the first memory chip and comprising second bond pads respectively connecting the first bond pads of the first memory chip, and a plurality of though silicon vias (TSVs) formed proximate at least one edge of the first interposer chip, a second memory chip comprising first bond pads and seated in a central portion of a second interposer chip, the second interposer chip being larger in area than the second memory chip and comprising second bond pads respectively connecting the first bond pads of the second memory chip, and a plurality of TSVs formed proximate at least one edge of the second interposer chip and respectively connected via vertical connection elements to the plurality of TSVs in the first interposer chip, wherein the first interposer is stacked on the second interposer and the plurality of TSVs in the second interposer chip are respectively connected to the plurality of base bond pads.

In another embodiment, the invention provides a semiconductor memory device comprising; a stacked plurality of interposer chips, each interposer chip seating a smaller corresponding memory chip, wherein a lowermost interposer chip in the stacked plurality of interposer chips is mounted on a buffer chip, each one of the stacked plurality of interposer chips comprising a central portion comprising bond pads seating the corresponding memory device and a peripheral portion comprising a plurality of through silicon vias (TSVs), wherein the respective pluralities of TSVs for adjacent interposer chips in the stacked plurality of interposer chips are connected via vertical connection elements to form multiple internal signal paths communicating write data from and read data to the buffer chip from respective memory chips.

DETAILED DESCRIPTION OF THE INVENTION

Figure 1:
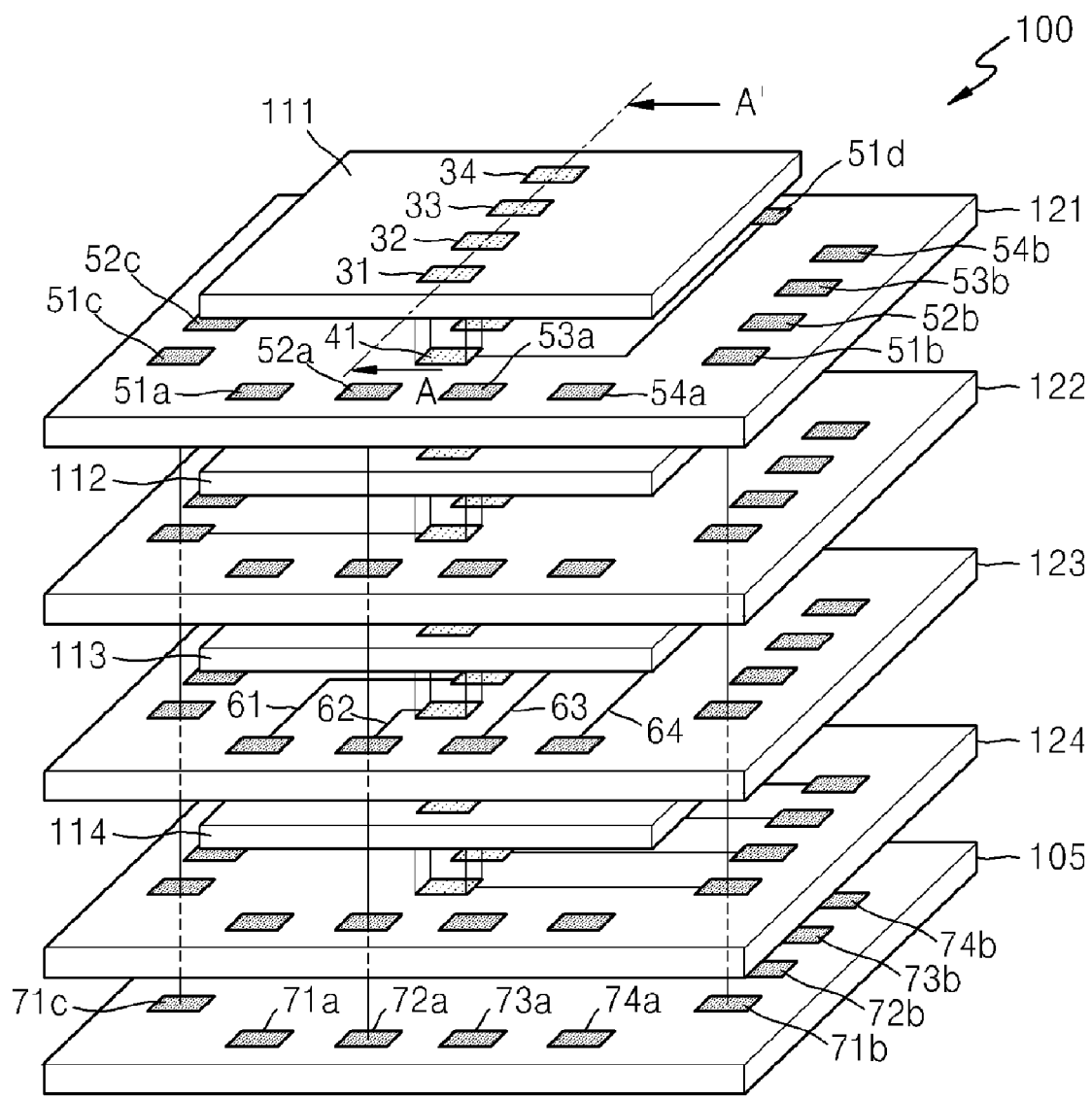
FIG. 1 is a diagram illustrating a semiconductor memory device according to an embodiment of the invention.

The present invention will now be described in some additional details with reference to the accompanying drawings. However, the invention may be various embodiments and should not be construed as being limited to only the illustrated embodiments which are presented as teaching examples. Throughout the written description and drawings, similar reference numerals are used to denote similar elements.

Figure 2:
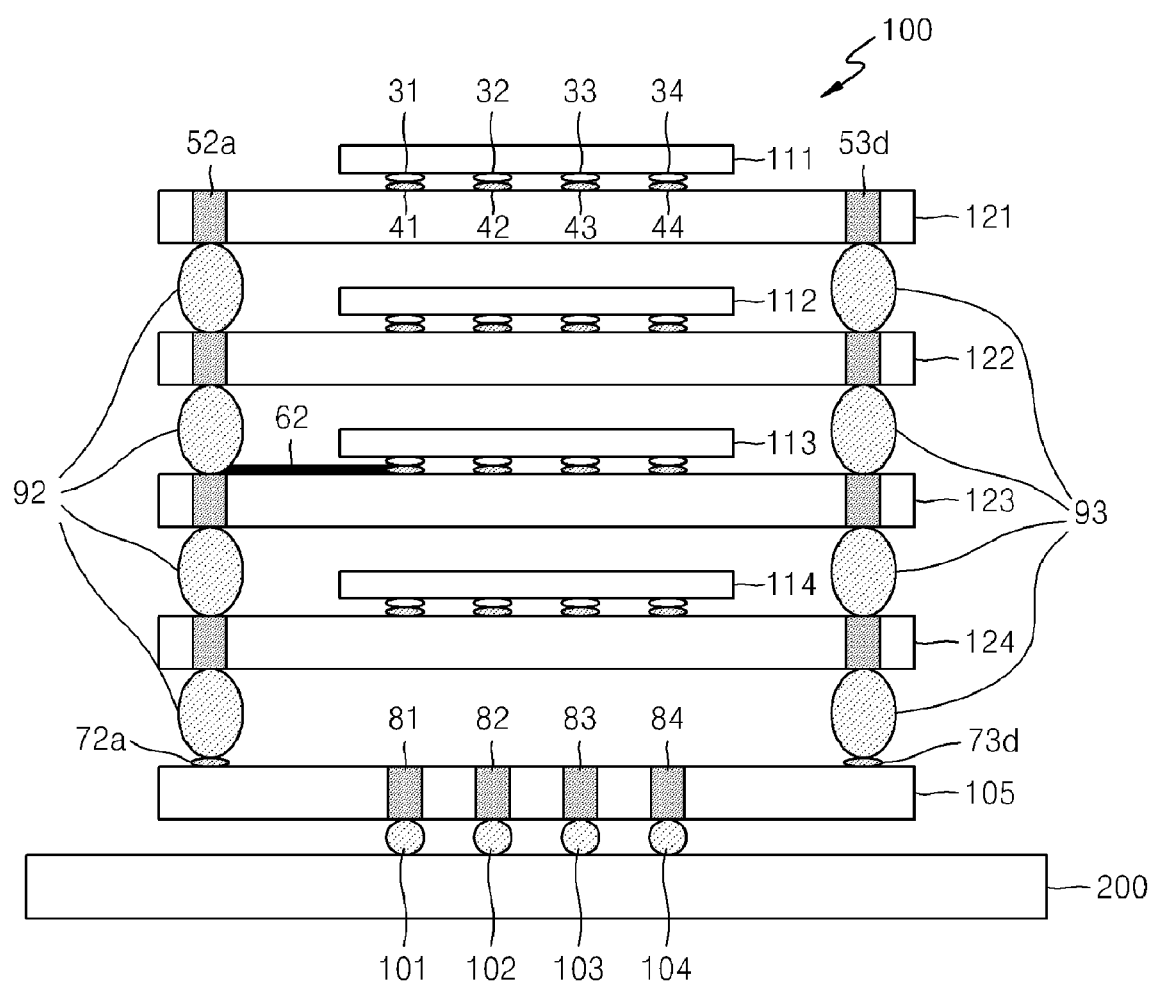
FIG. 2 is a cross-sectional view of the semiconductor memory device shown in FIG. 1 taken along a line A-A'.

Figure (FIG.) 1 is a diagram illustrating a semiconductor memory device 100 according to an embodiment of the invention and FIG. 2 is a cross-sectional view of semiconductor memory device 100 shown in FIG. 1 taken along a line A-A'.

Referring to FIGS. 1 and 2, semiconductor memory device 100 includes a plurality of stacked memory chips 111, 112, 113, and 114. In this context, the term "stacked" is a geometrically relative term. In the illustrated embodiment shown in FIG. 1, the uppermost memory chip 111 may be said to be stacked "on" one or all of memory chips 112, 113 and 114, despite the presence of one or more intervening elements, such as interposer chips 121, 122, 123, and 124. Each interposer chip is respectively placed (or disposed) between adjacent memory chips 111, 112, 113, and 114 in the stacked plurality of memory chips. Interposer chip 124 is placed between the lowermost memory chip 114 and a buffer chip 105.

Here again, terms such as upper, lower, uppermost, lowermost, over, under, etc., are used to describe the making and use of the illustrated embodiments. These terms are, however, geometrically relative and should not be construed as dictating a particular orientation or arrangement of elements in one or more geometric planes.

In various embodiments of the invention, memory chips 111, 112, 113, and 114 may be bare semiconductor dies or packaged (wholly or partially) semiconductor dies. In one embodiment, memory chips 111, 112, 113, and 114 may be dynamic random access memory (DRAM) chips provided as fully packaged products.

In the illustrated embodiment, each memory chip 111, 112, 113, and 114 comprises a plurality of first bond pads 31, 32, 33, and 34 adapted to communicate (e.g., input data to and/or output data from) the memory chip. Thus, the first bond pads may be viewed as a plurality of Input/Output (I/O) pads. Only four (4) first bond pads are shown in the embodiment of FIG. 1 (i.e., a number of I/O pads sufficient to communicate ×4 data), but any reasonable number of first bond pads may be used in other embodiments of the invention.

Each interposer chip 121, 122, 123, and 124 comprises second bond pads 41, 42, 43, and 44 that mirror in arrangement and respectively contact the first bond pads 31, 32, 33, and 34 of a corresponding memory chip 111, 112, 113, and 114. Hereafter, a memory chip arranged on an interposer chip and electrically connected through first and second bond pads is said to be "a memory chip seated on an corresponding interposer chip." Each interposer chip 121, 122, 123, and 124 also comprises a plurality of through substrate vias (TSVs), (e.g., collectively, bond pads 51a to 54a, 51b to 54b, 51c to 54c, and 51d to 54d arranged on respective edges of the interposer chip).

In the illustrated embodiment of FIG. 1, each interposer chips 121, 122, 123, and 124 is larger than the corresponding memory chips 111, 112, 113, and 114. Each second bond pad 41, 42, 43, and 44 on each interposer chip may be variously and respectively connected to one or more of the plurality of TSVs via one or more distribution lines (e.g., 61, 62, 63, and 64). In the embodiment illustrated in FIG. 1, for example, second bond pads 41, 42, 43, and 44 of first interposer chip 121 are respectively connected to a fourth set of TSVs 51d to 54d arranged on the back edge of first interposer chip 121. Second bond pads 41, 42, 43, and 44 of second interposer chip 122 are connected to a third set of TSVs 51c to 54c arranged on the left side of second interposer 122. Second bond pads 41, 42, 43, and 44 of third interposer chip 123 are connected to a first set of TSVs 51a to 54a arranged on the front side of third interposer 123, and second bond pads 41, 42, 43, and 44 of fourth interposer chip 124 are connected to a second set of TSVs 51b to 54b arranged on the right side of fourth interposer chip 124.

Buffer chip 105 comprises a plurality of base bond pads 71 (e.g., collectively bond pads 71a to 74a, 71b to 74b, 71c to 74c, and 71d to 74d arranged on the respective sides of buffer chip 105). In the illustrated example of FIG. 1, the plurality of base bond pads (e.g., 71a to 74a, 71b to 74b, 71c to 74c, and 71d to 74d) correspond in their respective arrangements to the plurality of TSVs (e.g., 51a to 54a, 51b to 54b, 51c to 54c, and 51d to 54d) arranged on each interposer chip 121, 122, 123, and 124. As shown in FIG. 2, buffer chip 105 also comprises a plurality of base TSVs (e.g., 81, 82, 83, and 84) adapted for connection to landing pads (e.g., solder balls) 101, 102, 103 and 104 of substrate 200 (e.g., a PCB).

Figure 3:
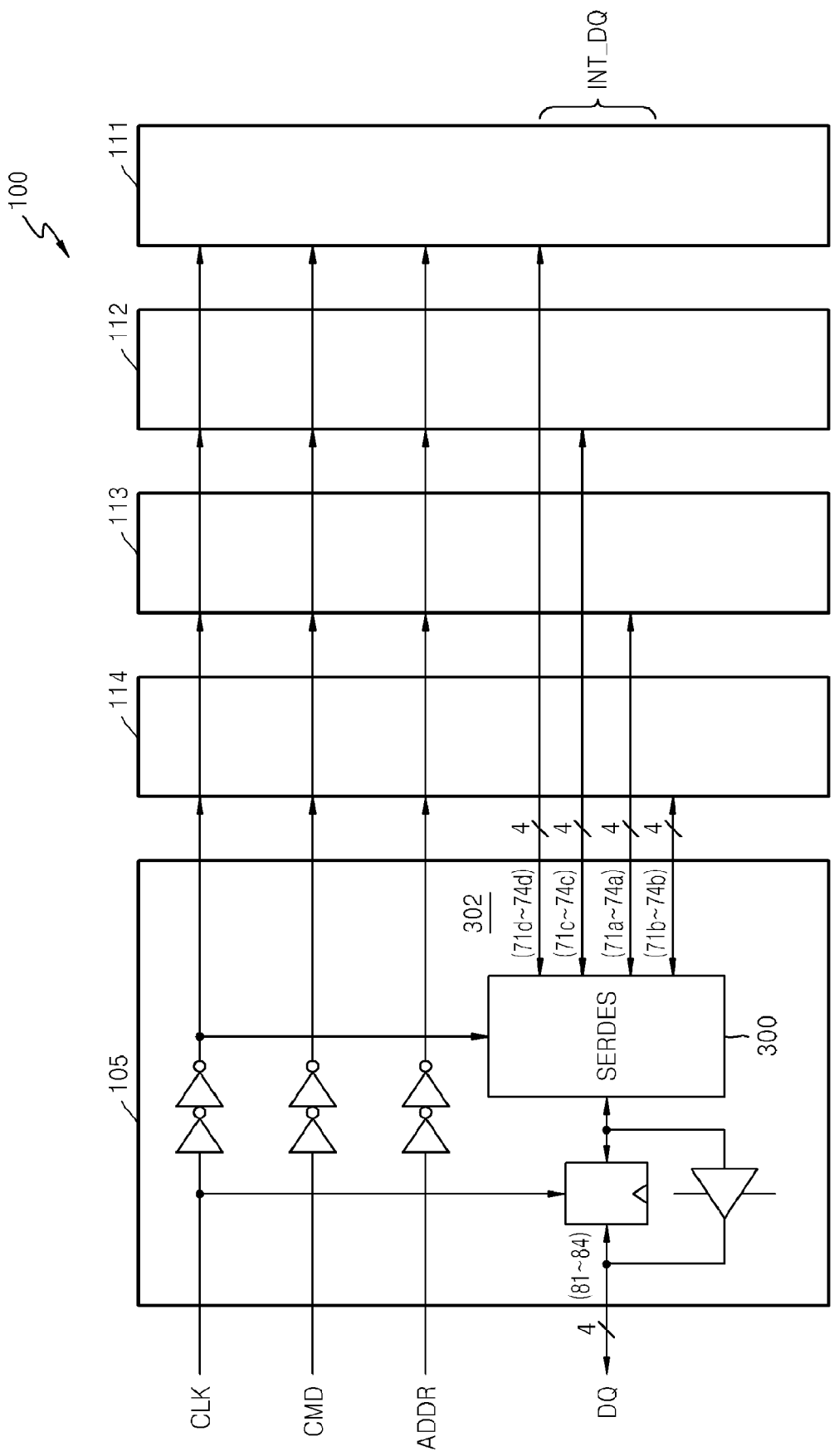
FIG. 3 is a block diagram of an exemplary buffer chip, such as the type that may be incorporated into the embodiment shown in FIG. 1.

In one embodiment further illustrated in FIG. 3, buffer chip 105 comprises a serializer/deserializer (SERDES) 300. SERDES 300 receives 4-bit serial data (DQ) via the plurality of base TSVs 81, 82, 83, and 84 from an external circuit (not shown) and respectively communicates multiple 4-bit parallel signals to memory chips 111, 112, 113, and 114 via the plurality of base bond pads 71a to 74a, 71b to 74b, 71c to 74c, and 71d to 74d.

In one embodiment of the invention, solder balls 101, 102, 103, and 104 respectively connected the plurality of base TSVs 81, 82, 83, and 84 of buffer chip 105 to electrical circuits and/or distribution lines of substrate 200. Respective memory chips 111, 112, 113, and 114 are "seated" or mounted using (e.g.,) conventional surface mount techniques on a corresponding interposer chip 121, 122, 123, and 124. In one embodiment, each memory chip is seated in a manner that the respective first surfaces of each memory chip 111, 112, 113, and 114 on which circuitry is primarily patterned faces a corresponding interposer chip 121, 122, 123, and 124. In relative geometric terms drawn to the illustrated embodiment of FIG. 2, memory chips 111, 112, 113, and 114 are seated face down on a corresponding interposer chip 121, 122, 123, and 124.

Since each interposer chip 121, 122, 123, and 124 has a larger overall surface area than its seated memory chip 111, 112, 113, and 114, the plurality of TSVs for each interposer chip in the stacked plurality of interposer chips 121, 122, 123, and 124 may be readily connected via TSV connections elements, such as vertical connection bumps 92 and 93. Thus, the combination of the plurality of base bond pads 71a to 74a, 71b to 74b, 71c to 74c, and 71d to 74d, the respective pluralities of TSVs in interposer chips 121, 122, 123, and 124, and the intervening vertical connection bumps 92 and 93 may be viewed as implementing multiple (i.e., 4 in the illustrated example) parallel "internal signal paths" 302 up the respective sides of the stacked semiconductor memory device 100. (See, FIG. 3). Indeed, with reference to the illustrated embodiment of FIG. 3, a first set of base bond pads 71a-74a implement a first internal signal path to third memory device 113, a second set of base bond pads 71b-74b implement a second internal signal path to fourth memory device 114, a third set of base bond pads 71c-74c implement a third internal signal path to second memory device 112, and a fourth set of base bond pads 71d-74d implement a fourth internal signal path to first memory device 111. In this manner, up to sixteen bits of I/O data may be communicated to/from memory chips 111, 112, 113, and 114 through buffer chip 105.

FIG. 3 further illustrates buffer chip 105 of FIG. 1. Referring to FIG. 3, during a write operation, buffer chip 105 receives "write data" via the plurality of base TSVs 81, 82, 83, and 84 connected respectively to solder balls 101, 102, 103, 104 which serve as data I/O pads within semiconductor memory device 100. SERDES 300 receives and processes the write data, converting it into parallel data from its serial input form. Thus, up to 16 bits of parallel data (e.g., arranged in up to four groups of 4-bit data) may be communicated from SERDES 300 to one or more of memory chips 111, 112, 113, and 114 via one or more of the first through fourth internal signal paths 302.

During a read operation, up to 16 bits of "read data" provided through the respective first bond pads 31 to 34 of one or more of first through fourth memory chips 111, 112, 113, and 114 is communicated to SERDES 300 one or more of the internal signal paths 302. SERDES 300 receives the parallel read data and processes it into serial data from export to an external circuit via the plurality of base TSVs 81, 82, 83, and 84 and solder balls 101, 102, 103, and 104.

As also shown in FIG. 3, buffer chip 105 may comprise circuitry buffering a clock signal CLK, a command signal CMD, and address signals ADDR provided to (or by) semiconductor memory device 100. These control and address signals may be communicated to first through fourth memory chips 111, 112, 113, and 114 in serial or parallel using additional internal signal paths implemented using an arrangement of TSVs and vertical connection elements.

In the foregoing embodiments, memory devices 111, 112, 113, and 114 have been assumed to be finished (or fully packaged) DRAMs. However, this need not be the case. For example, buffer chip 105 may be implemented as a memory core interface chip, and first through fourth memory chips 111, 112, 113, and 114 may be implemented as first through fourth memory cores substantially comprising only memory cell array(s) and corresponding peripheral circuitry.

Figure 4:
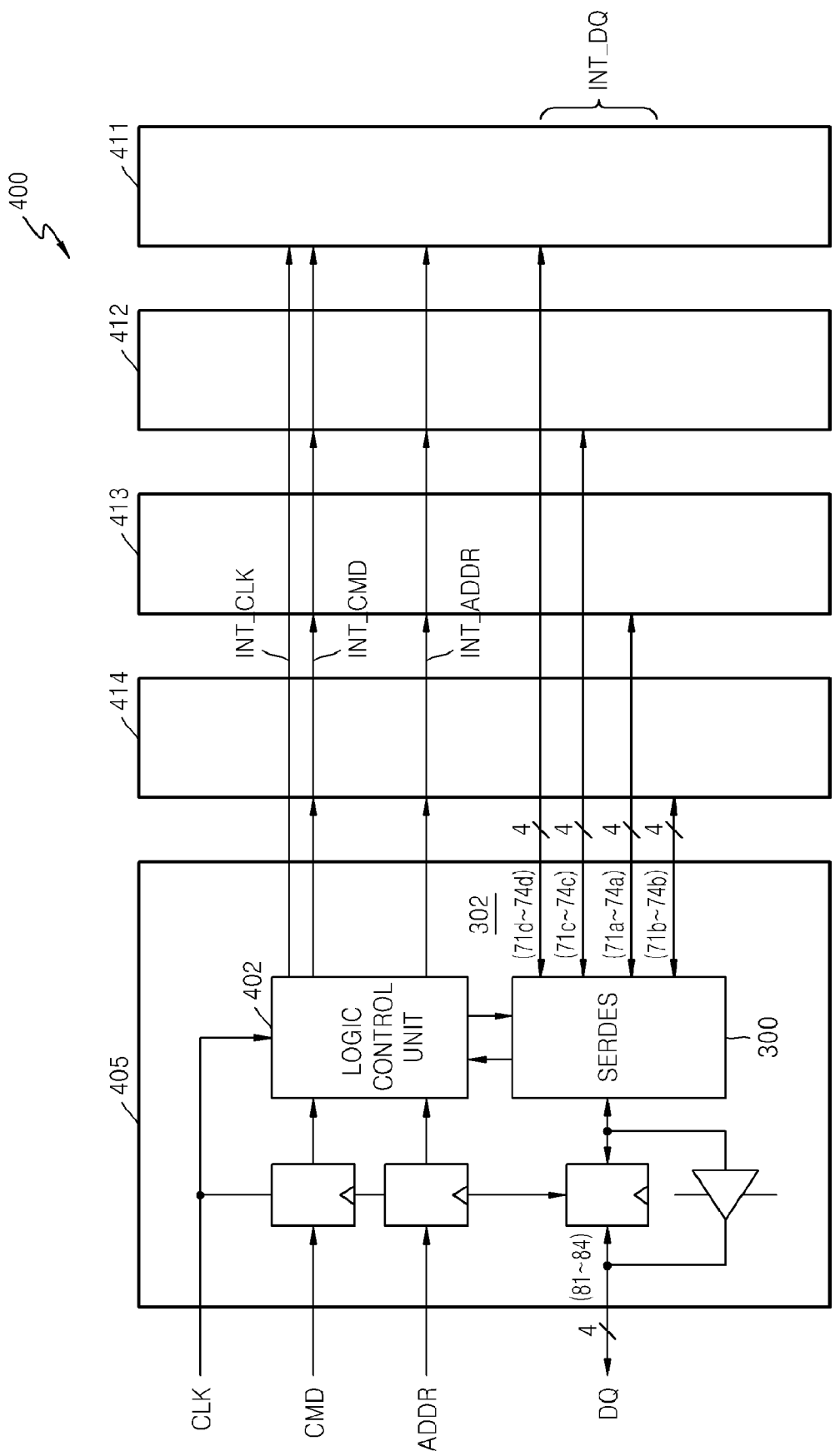
FIG. 4 is a diagram illustrating a semiconductor memory device according to an embodiment of the invention on which an interface chip and core chips are mounted.

FIG. 4 is a diagram illustrating semiconductor memory device 400 according to an embodiment of the invention. Semiconductor memory device 400 comprises an interface chip 405 and memory core chips 411, 412, 413, and 414 mounted on interface chip 405. Interface chip 405 and first through fourth memory core chips 411 to 414 function within the stacked semiconductor memory device in a manner similar to that of buffer chip 105 and first through fourth memory chips 111 to 114 described with reference to FIGS. 1 and 2.

Referring to FIG. 4, interface chip 405 comprises SERDES 300, as before, but further comprises a control logic unit 402. Control logic unit 402 may be used to generate an internal clock signal INT_CLK, an internal command signal INT_CMD, and an internal address signal INT_ADDR in response to the received clock signal CLK, command signal CMD, and address signals ADDR. The internal clock signal INT_CLK, the internal command signal INT_CMD, and/or the internal address signal INT_ADDR may then be communicated to first through fourth memory core chips 411 to 414.

In all other respects, SERDES 300 of FIG. 4 functions in conjunction with the provided internal signal paths (INT_DQ) to communicate read data from and write data to the respective memory core chips 411 to 414.

Figure 5:
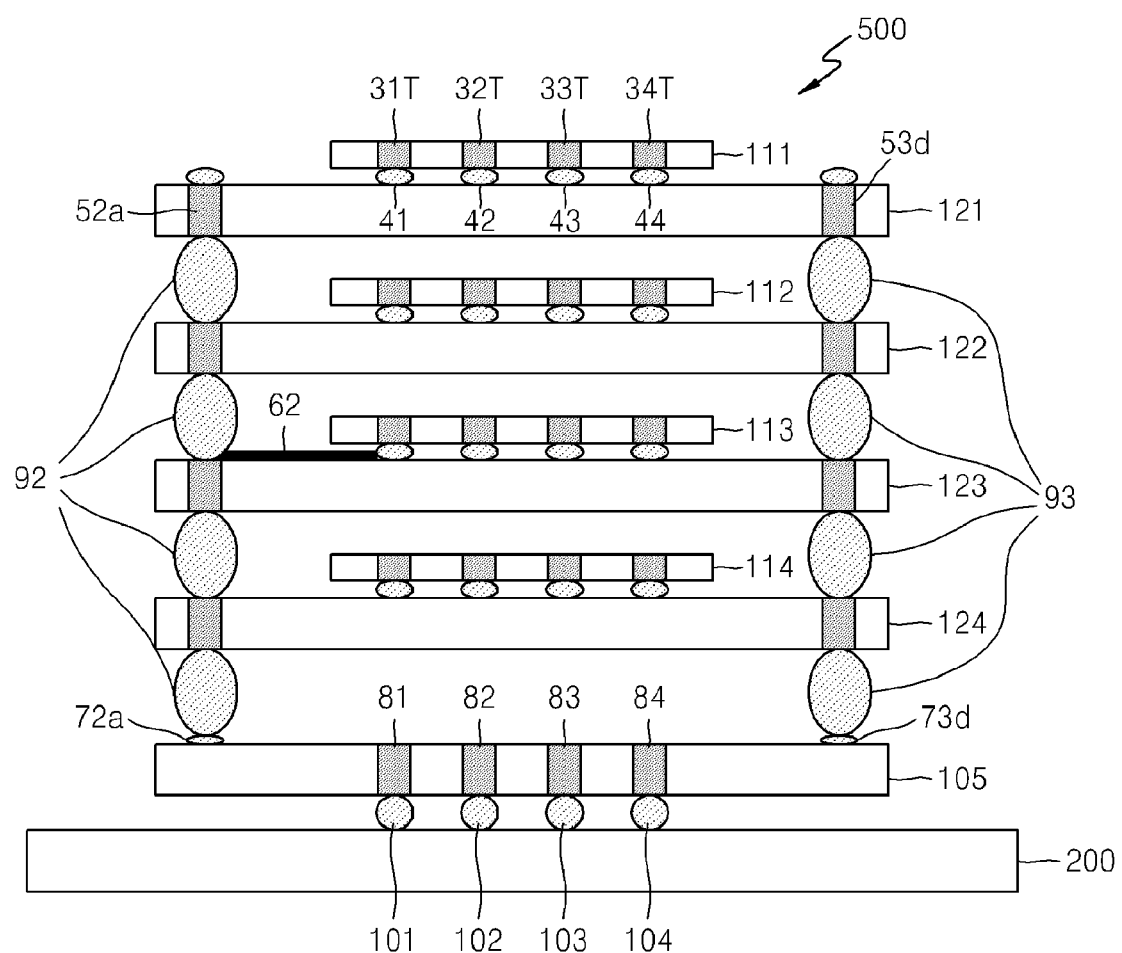
FIG. 5 is a cross-sectional view of the semiconductor memory device shown in FIG. 1 taken along a line A-A'.

FIG. 5 is another cross-sectional view of semiconductor memory device 500 which his similar in general make-up to semiconductor memory device 100 of FIG. 1. However, in FIG. 5, memory chips 111, 112, 113, and 114 are mounted face up (i.e., with their respective first surfaces facing upward and using "backside" connection techniques to connect with a corresponding interposer chip 121, 122, 123, and 124). For example, each memory chip 111, 112, 113 and 114 may comprise a plurality of internal TSVs (e.g., 31T, 32T, 33T and 34T) allowing electrical connection between the first surface and the corresponding interposer chip.

Figure 6:
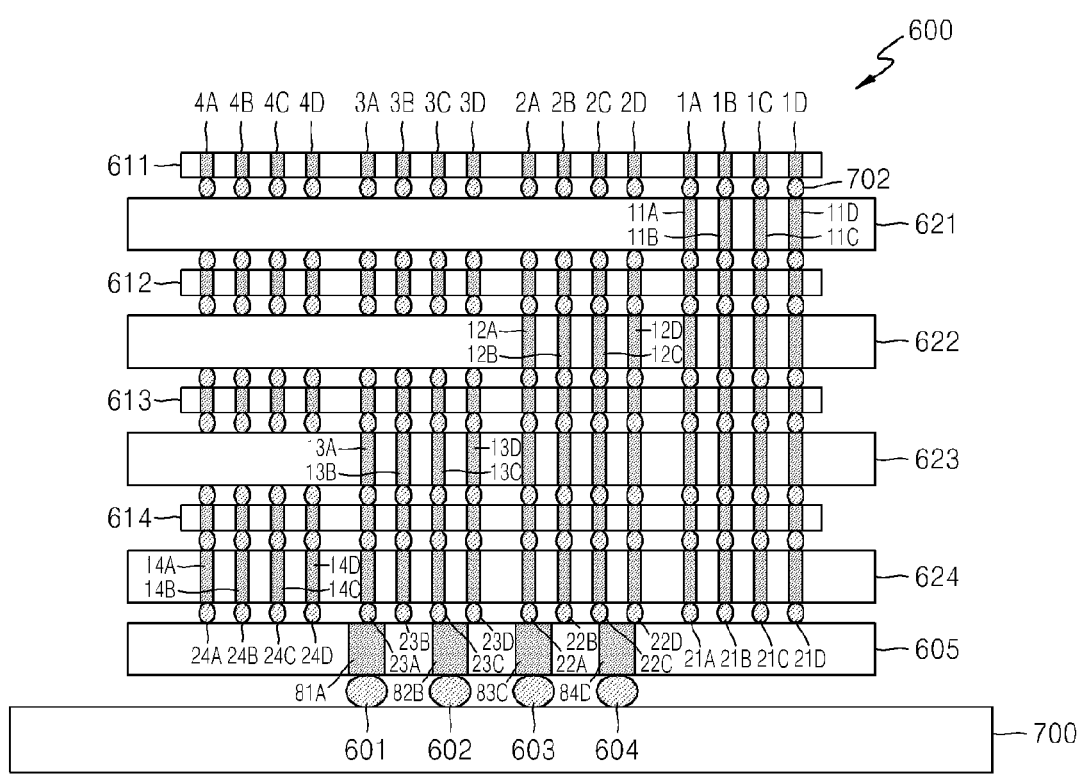
FIG. 6 is a diagram illustrating a semiconductor memory device according to another embodiment of the invention.

FIG. 6 is a diagram illustrating a semiconductor memory device 600 according to another embodiment of the invention.

Referring to FIG. 6, semiconductor memory device 600 comprises a plurality of memory chips 611, 612, 613, and 614, interposer chips 621, 622, 623, and 624 disposed between adjacent memory chips 611, 612, 613, and 614, and a buffer chip 605. Buffer chip 605 comprises a plurality of base TSVs 81A, 82B, 83C, and 84D respectively connected to solder balls 601, 602, 603, and 604 disposed on PCB 700.

Within this embodiment, memory chips 611, 612, 613, and 614 may be bare semiconductor dies (e.g., memory core chips) or packaged semiconductor dies (fully or partially packaged memory devices). For example, memory chips 611, 612, 613, and 614 may be DRAM chips as above. Alternatively, memory chips 611, 612, 613, and 614 may be memory core chips. Further, memory chips 611, 612, 613, and 614 may be face down or face up in their seated disposition.

In contrast to the foregoing embodiments that assumed 4-bit wide internal signal paths respectively formed up each side of the stacked interposer chips, semiconductor memory device 600 assumes 16-bit wide internal signal paths formed up each side of the stacked interposer chips. Thus, each memory chip 611, 612, 613, and 614 comprises a plurality of TSVs (e.g., including collectively 1A to 1D, 2A to 2D, 3A to 3D, and 4A to 4D) connected on each side to 16 base bond pads (e.g., base I/O pads (e.g., 21a-21d, 22a-22d, 23a-23d, and 24a-24d).

In the illustrated embodiment of FIG. 6, first memory chip 611 inputs/outputs data via a first set of TSVs 1A to 1D. Second memory chip 612 inputs/outputs data via a second set of TSVs 2A to 2D. Third memory chip 613 inputs/outputs data via a third set of TSVs 3A to 3D, and fourth memory chips 614 inputs/outputs data via a fourth set of TSVs 4A to 4D, where the first through fourth set of TSVs are co-located on a single side of the stacked plurality of interposer chips.

Hence, interposer chips 621, 622, 623, and 624 include TSVs 11A to 11D, 12A to 12D, 13A to 13D, and 14A to 14D, which are selectively connected to first through fourth sets of TSVs 1A to 1D, 2A to 2D, 3A to 3D, and 4A to 4D. Thus, TSVs 11A to 11D associated with first interposer chip 621 respectively contact internal TSVs 1A to 1D of first memory chip 611. TSVs 11A to 11D and 12A to 12D associated with second interposer chip 622 respectively contact internal TSVs 1A to 1D and 2A to 2D of second memory chip 612. TSVs 1A to 1D, 12A to 12D, and 13A to 13D associated with third interposer chip 623 respectively contact internal TSVs 1A to 1D, 2A to 2D, and 3A to 3D of third memory chip 613, and TSVs 11A to 11D, 12A to 12D, 13A to 13D, and 14A to 14D associated with fourth interposer chip 624 respectively contact internal TSVs 1A to 1D, 2A to 2D, 3A to 3D, and 4A to 4D of fourth memory chip 614. Vertical connections bumps 702 are interposed between internal TSVs 1A to 1D, 2A to 2D, 3A to 3D, and 4A to 4D and the plurality of TSVs 11A to 11D, 12A to 12D, 13A to 13D, and 14A to 14D.

Thus, first memory chip 611 communicates data via a first internal signal path that connects TSVs 1A to 1D of the first through fourth memory chips 611, 612, 613, and 614, TSVs 11A to 11D of the first through fourth interposer chips 621, 622, 623, and 624, and base bond pads 21A to 21D of buffer chip 605 with base TSVs 81A, 82B, 83C, and 84D. Second memory chip 612 communicates data via a second internal data path that connects TSVs 2A to 2D of the second through fourth memory chips 612, 613, and 614, TSVs 12A to 12D of the second through fourth interposer chips 622, 623, and 624, and base bond pads 22A to 22D of buffer chip 605 with base TSVs 81A, 82B, 83C, and 84D. Third memory chip 613 communicates data via a third internal data path that connects TSVs 3A to 3D of the third and fourth memory chips 613 and 614, TSVs 13A to 13D of the third and fourth interposer chips 623 and 624, and base bond pads 23A to 23D of buffer chip 605 with base TSVs 81A, 82B, 83C, and 84D, and fourth memory chip 614 communicates data via a fourth internal data path that connects TSVs 4A to 4D of first memory chip 614, TSVs 14A to 14D of fourth interposer chip 624, and base bond pads 24A to 24D of buffer chip 605 with base TSVs 81A, 82B, 83C, and 84D.

Buffer chip 605 includes the base bond pads 21A to 21D, 22A to 22D, 23A to 23D, and 24A to 24D which respectively contact TSVs 11A to 11D, 12A to 12D, 13A to 13D, and 14A to 14D of fourth interposer chip 624, and base TSVs 81A, 82B, 83C, and 84D. Base TSVs 81A, 82B, 83C, and 84D are respectively connected to solder balls 601, 602, 603, and 604 disposed on substrate 700.

As before, buffer chip 605 may comprise an SERDES (not shown) like the buffer chip 105 of FIG. 3 and the interface chip 405 of FIG. 4. Thus, buffer chip 605 may process serial data received through solder balls 601, 602, 603, and 604 which serve as data I/O pads for semiconductor memory device 600 and base TSVs 81A, 82B, 83C, and 84D in order to generate 16-bit parallel data. Thereafter, buffer chip 605 communicates up to 16 bits of parallel data via base bond pads 21A to 21D, 22A to 22D, 23A to 23D, and 24A to 24D and the various internal signal paths described above to reach one or more of memory chips 611 to 614.

In the foregoing embodiments, a stacked semiconductor memory device 100/600 is implemented to increase integration density and preserve the surface area of a substrate mounting the device. Assuming that a data rate at which data is input to or output from individual memory chips 111 to 114 (or 611 to 614) is "f", the foregoing embodiments provide data at a rate of "4f" via the multiple internal signal paths implemented through the stacked interposer chips.

While the present invention has been particularly shown and described with reference to exemplary embodiments thereof, it will be understood by one of ordinary skill in the art that various changes in form and details may be made therein without departing from the scope of the present invention as defined by the following claims.

What is claimed is:

1. A semiconductor memory device comprising:
    a buffer chip comprising a plurality of base bond pads receiving externally provided write data and providing read data, wherein the buffer chip comprises a plurality of base through silicon vias (TSVs) respectively connected to the plurality of base bond pads, and a plurality of solder balls respectively connecting the plurality of base TSVs to a substrate mounting the device;
    a first memory chip comprising first bond pads and being seated in a central portion of a first interposer chip, the first interposer chip being larger in area than the first memory chip and comprising second bond pads respectively connecting the first bond pads of the first memory chip, and a plurality of TSVs formed proximate at least one edge of the first interposer chip;
    a second memory chip comprising first bond pads and being seated in a central portion of a second interposer chip, the second interposer chip being larger in area than the second memory chip and comprising second bond pads respectively connecting the first bond pads of the second memory chip, and a plurality of TSVs formed proximate at least one edge of the second interposer chip and respectively connected via vertical connection elements to the plurality of TSVs in the first interposer chip,
    wherein the first interposer is stacked on the second interposer and the plurality of TSVs in the second interposer chip are respectively connected to the plurality of base bond pads,
    the first and second memory chips are memory core chips, and
    the buffer chip is an interface chip comprising:
        a serializer/deserializer (SERDES) receiving serial write data and providing serial read data via the plurality of base TSVs, and receiving parallel read data and providing parallel write data via the plurality of base bond pads; and
        a logic control circuit receiving an external clock signal, an external command signal, and an external address signal, generating an internal clock signal, an internal command signal, and an internal address signal, and communicating the internal clock signal, internal command signal, and internal address signal to the first and second memory chips.

2. The device of claim 1, wherein the first interposer chip further comprises a plurality of distribution lines respectively connecting a second bond pad with at least one of the plurality of TSVs.

3. The device of claim 1, wherein the first memory chip is a bare semiconductor die or packaged semiconductor die.

4. The device of claim 1, wherein the buffer chip further comprises:
    circuitry buffering a clock signal, a command signal, and an address signal received from the substrate and communicating buffered versions of the clock signal, the command signal, and the address signal to the first and second memory chips.

5. The device of claim 1, wherein the first memory chip is seated face down on the first interposer chip.

6. The device of claim 1, wherein the first memory chip comprises a plurality of internal TSVs respectively connected to the second bond pads and the first memory chip is seated face up on the first interposer chip.

7. The device of claim 1, wherein the vertical connection elements are solder balls.

8. A semiconductor memory device comprising:
    a stacked plurality of interposer chips, each interposer chip seating a smaller corresponding memory chip, wherein a lowermost interposer chip in the stacked plurality of interposer chips is mounted on a buffer chip, wherein the buffer chip comprises a plurality of base through silicon vias (TSVs) respectively connected to a plurality of base bond pads, and a plurality of solder balls respectively connecting the plurality of base TSVs to a substrate mounting the device;
    each one of the stacked plurality of interposer chips comprising a central portion comprising bond pads seating the corresponding memory device and a peripheral portion comprising a plurality of TSVs,
    wherein the respective pluralities of TSVs for adjacent interposer chips in the stacked plurality of interposer chips are connected via vertical connection elements to form multiple internal signal paths communicating write data from and read data to the buffer chip from respective memory chips,
    the memory chips are memory core chips, and
    the buffer chip is an interface chip comprising:
        a serializer/deserializer (SERDES) receiving serial write data and providing serial read data via the plurality of base TSVs, and receiving parallel read data and providing parallel write data via the plurality of base bond pads; and
        a logic control circuit receiving an external clock signal, an external command signal, and an external address signal, generating an internal clock signal, an internal command signal, and an internal address signal, and communicating the internal clock signal, internal command signal, and internal address signal to the memory chips.

9. The device of claim 8, wherein each interposer chip further comprises a plurality of distribution lines respectively connecting the bond pads to the plurality of TSVs.

10. The device of claim 8, wherein the buffer chip further comprises:
    circuitry buffering a clock signal, a command signal, and an address signal received from the substrate and communicating buffered versions of the clock signal, the command signal, and the address signal to the first and second memory chips.

11. The device of claim 8, wherein each memory chip is seated face down on the corresponding interposer chip.

12. The device of claim 8, wherein each memory chip comprises a plurality of internal TSVs respectively connected to the bond pads and wherein each memory chip is seated face up on the corresponding interposer chip.

13. The device of claim 8, wherein the vertical connection elements are solder balls.

* * * * *